(12) United States Patent
Kim et al.

(10) Patent No.: US 8,785,936 B2
(45) Date of Patent: Jul. 22, 2014

(54) ORGANIC ELECTROLUMINESCENT DISPLAY DEVICE

(75) Inventors: Na-Young Kim, Yongin (KR); Ki-Nyeng Kang, Yongin (KR); Wang-Jo Lee, Yongin (KR); In-Ho Choi, Yongin (KR); Jin-Gon Oh, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 71 days.

(21) Appl. No.: 13/244,138

(22) Filed: Sep. 23, 2011

(65) Prior Publication Data

US 2012/0211752 A1  Aug. 23, 2012

(30) Foreign Application Priority Data

Feb. 17, 2011  (KR) ........................ 10-2011-0014222

(51) Int. Cl.
 *H01L 27/32* (2006.01)
 *H01L 27/12* (2006.01)
(52) U.S. Cl.
 CPC .......... *H01L 27/124* (2013.01); *H01L 27/3211* (2013.01); *H01L 27/3276* (2013.01); *H01L 27/3262* (2013.01)
 USPC ........................ 257/59; 257/79; 257/E27.121

(58) Field of Classification Search
 CPC ............ H01L 27/3262; H01L 27/3276; H01L 27/3211; G09G 3/3225
 USPC ........................ 257/59, 72, E27.119, E27.121
 See application file for complete search history.

(56) References Cited

U.S. PATENT DOCUMENTS

2002/0180902 A1* 12/2002 Izumi et al. ..................... 349/43
2006/0119556 A1*  6/2006 Winters et al. .................. 345/82

FOREIGN PATENT DOCUMENTS

KR  10-2005-0111966 A  11/2005

* cited by examiner

*Primary Examiner* — Yu Chen
(74) *Attorney, Agent, or Firm* — Christie, Parker & Hale, LLP

(57) ABSTRACT

An organic electroluminescent display device including a plurality of scan lines and a plurality of data lines crossing the scan lines, a plurality of pixels at regions defined by the scan lines and the data lines, and one or more thin-film transistors (TFTs) for selectively applying voltages to each of the pixels, wherein the data lines are successively located at a side of the pixels, and a first TFT of the TFTs is located at least partially between an area corresponding to an $n^{th}$ data line of the data lines and an area corresponding to an $(n-1)^{th}$ data line of the data lines, the $n^{th}$ data line and the $(n-1)^{th}$ data line being successively positioned.

18 Claims, 8 Drawing Sheets

ORGANIC ELECTROLUMINESCENT DISPLAY DEVICE

CROSS-REFERENCE TO RELATED APPLICATION

This application claims priority to and the benefit of Korean Patent Application No. 10-2011-0014222, filed on Feb. 17, 2011 in the Korean Intellectual Property Office, the disclosure of which is incorporated herein by reference in its entirety.

BACKGROUND

1. Field

The present invention relates to an organic electroluminescent display device.

2. Description of Related Art

As the demand for portable displays (such as mobile phones, notebooks, and personal digital assistants (PDAs)) increases, the development of flat panel displays (FPDs) is being required. Of the FPDs, organic electroluminescent display devices using organic electroluminescent elements are particularly being actively developed. An organic electroluminescent element is a self-luminous element that emits light by itself. Thus, organic electroluminescent display devices using organic electroluminescent elements can be more easily made thinner, since they do not require a backlight, which is essential in liquid crystal displays (LCDs) for luminance. Furthermore, organic electroluminescent display devices using organic electroluminescent elements exhibit wide viewing angle characteristics and high response speed characteristics.

SUMMARY

Aspects of embodiments according to the present invention provide an organic electroluminescent display device with reduced resistance-capacitance (RC) delay.

However, aspects of embodiments according to the present invention are not restricted to the one set forth herein. The above and other aspects of the present invention will become more apparent to one of ordinary skill in the art to which the present invention pertains by referencing the detailed description of the present invention given below.

According to an aspect of embodiments of the present invention, there is provided an organic electroluminescent display device including a plurality of scan lines and a plurality of data lines crossing the scan lines, a plurality of pixels at regions defined by the scan lines and the data lines, and one or more thin-film transistors (TFTs) for selectively applying voltages to each of the pixels, wherein the data lines are successively located at a side of the pixels, and a first TFT of the TFTs is located at least partially between an area corresponding to an $n^{th}$ data line of the data lines and an area corresponding to an $(n-1)^{th}$ data line of the data lines, the $n^{th}$ data line and the $(n-1)^{th}$ data line being successively positioned.

At least one of the pixels may be coupled to the $n^{th}$ data line by the first TFT.

A width of the pixels in a row direction may be greater than a length of the pixels in a column direction.

The data lines may extend in the column direction.

The pixels displaying a same color may be arranged in a first direction, and the data lines may extend along the first direction, and each of the pixels may coupled to one of the data lines.

The data lines may include a first data line and a second data line, and successive ones of the pixels may be alternately coupled to the first data line and the second data line.

The first TFT may be a switching element for applying a data voltage applied to one of the data lines in response to a selection signal transmitted to one of the scan lines.

The first TFT may include two gate electrodes, and the $(n-1)^{th}$ data line is located at a region corresponding to an area between the two gate electrodes.

According to another aspect of embodiments of the present invention, there is provided an organic electroluminescent display device including a plurality of scan lines and a plurality of data lines crossing the scan lines, a plurality of pixels located at regions defined by the scan lines and the data lines, and one or more TFTs for selectively applying voltages to each of the pixels, wherein the pixels displaying n different colors are alternately arranged in a first direction, n data lines are successively located at a side of the pixels to extend along the first direction, and at least a portion of a first TFT of the TFTs is between areas corresponding to successive data lines of the n data lines.

The first TFT corresponding to the pixel coupled to an $n^{th}$ data line of the data lines may be located between an area corresponding to the $n^{th}$ data line and an area corresponding to an $(n-1)^{th}$ data line of the data lines.

A red pixel, a green pixel, and a blue pixel may be successively arranged in the first direction and may be coupled to different ones of the data lines, respectively.

A width of the pixels in a row direction may be greater than a length of the pixels in a column direction.

The first direction may be a column direction.

Each of the pixels may include two or more TFTs and two or more capacitors electrically coupled to respective ones of the TFTs.

The first TFT may be a switching element for applying a data voltage applied to one of the data lines in response to a selection signal transmitted to one of the scan lines.

According to another aspect of embodiments of the present invention, there is provided an organic electroluminescent display device including a plurality of scan lines and a plurality of data lines crossing the scan lines, a plurality of pixels at regions defined by the scan lines and the data lines, a common power supply line for supplying common power to the pixels, and one or more TFTs for selectively applying voltages to each of the pixels, wherein the data lines and the common power supply line are successively and sequentially located from farthest from the pixels to closest to the pixels, and a first TFT of the TFTs is at least partially between an area corresponding to an $n^{th}$ data line of the data lines and an area corresponding to an $(n-1)^{th}$ data line of the data lines, the $n^{th}$ data line and the $(n-1)^{th}$ data line being successively located.

The first TFT may be coupled to a first data line of the data lines, the first data line being closest to the pixels, and may be at least partially between the first data line and the common power supply line.

The first TFT may include two gate electrodes, and the $(n-1)^{th}$ data line may be located at a region corresponding to an area between the two gate electrodes.

BRIEF DESCRIPTION OF THE DRAWINGS

The above and other aspects and features of embodiments of the present invention will become more apparent by the following detailed description of exemplary embodiments thereof with reference to the attached drawings, in which.

DETAILED DESCRIPTION

Figure 1:
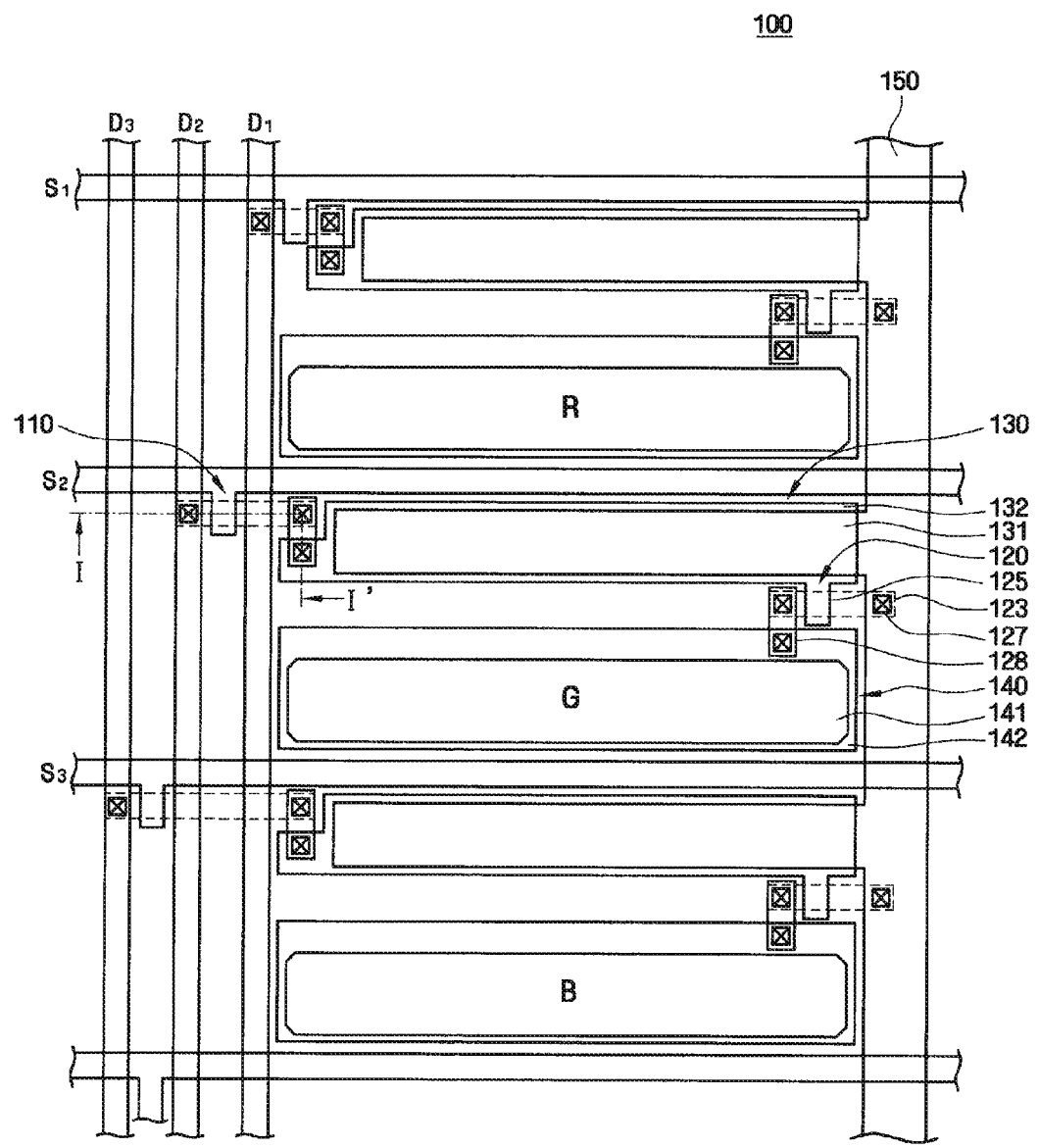
FIG. 1 is a plan view of an organic electroluminescent display device according to an exemplary embodiment of the present invention.

As display panels become larger in size and are required to provide higher image quality, a data writing time is reduced. Therefore, it is useful to secure the data writing time by minimizing or reducing the resistance-capacitance (RC) delay of data lines. Accordingly, various structures are suggested to reduce the RC delay of an organic electroluminescent display device.

To reduce the RC delay, a plurality of data lines may be arranged to pass by a single pixel. In this structure, however, parasitic capacitance is generated at a region in which a data line is coupled to a transistor, and the generated parasitic capacitance increases an RC value of the data line.

Aspects of embodiments of the present invention, and methods of accomplishing the same, may be understood more readily by reference to the following detailed description of exemplary embodiments and the accompanying drawings. The present invention may, however, be embodied in many different forms, and should not be construed as being limited to the embodiments set forth herein. Rather, these embodiments are provided so that this disclosure will be thorough and complete and will fully convey the concept of the invention to those skilled in the art, and the present invention will only be defined by the appended claims and equivalents thereof. In the drawings, relative sizes of layers and regions may be exaggerated for clarity.

It will be understood that when an element or layer is referred to as being "on" another element or layer, the element or layer can be directly on the element or layer, or intervening elements or layers may also be present. In contrast, when an element is referred to as being "directly on" another element or layer, there are no intervening elements or layers present. As used herein, the term "and/or" includes any and all combinations of one or more of the associated listed items.

Spatially relative terms, such as "below", "beneath", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation, in addition to the orientation depicted in the figures. Like reference numerals refer to like elements throughout the specification.

Embodiments of the present invention are described herein with reference to plan and cross-section illustrations that are schematic illustrations of idealized embodiments of the present invention. As such, variations from the shapes of the illustrations as a result of, for example, manufacturing techniques and/or tolerances, are to be expected. Thus, embodiments of the present invention should not be construed as limited to the particular shapes of regions illustrated herein, but should be construed to include variations in shapes that result, for example, from manufacturing. Thus, the regions illustrated in the figures are schematic in nature, and their shapes are not intended to illustrate the actual shape of a region of a device and are not intended to limit the scope of the present invention.

Hereinafter, exemplary embodiments of the present invention will be described in further detail with reference to the accompanying drawings.

Figure 2:
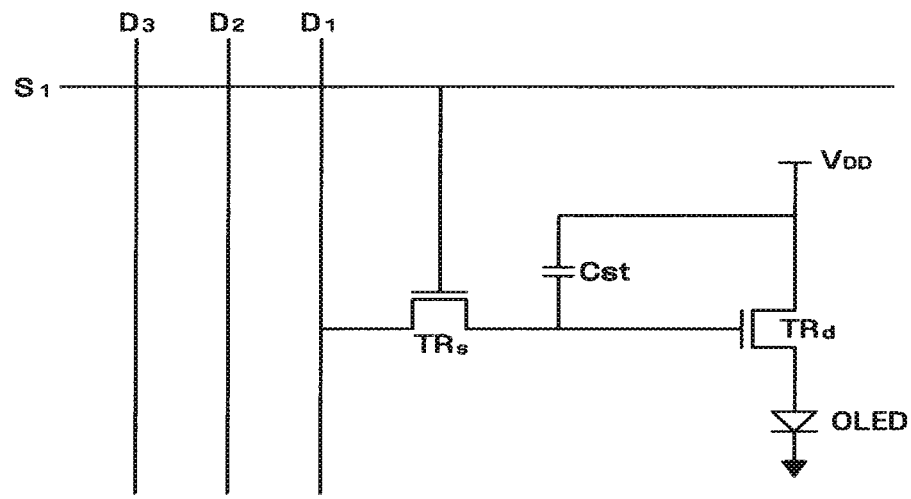
FIG. 2 is an equivalent circuit diagram of a pixel coupled to a first data line in the organic electroluminescent display device of the embodiment shown in FIG. 1.
Figure 3:
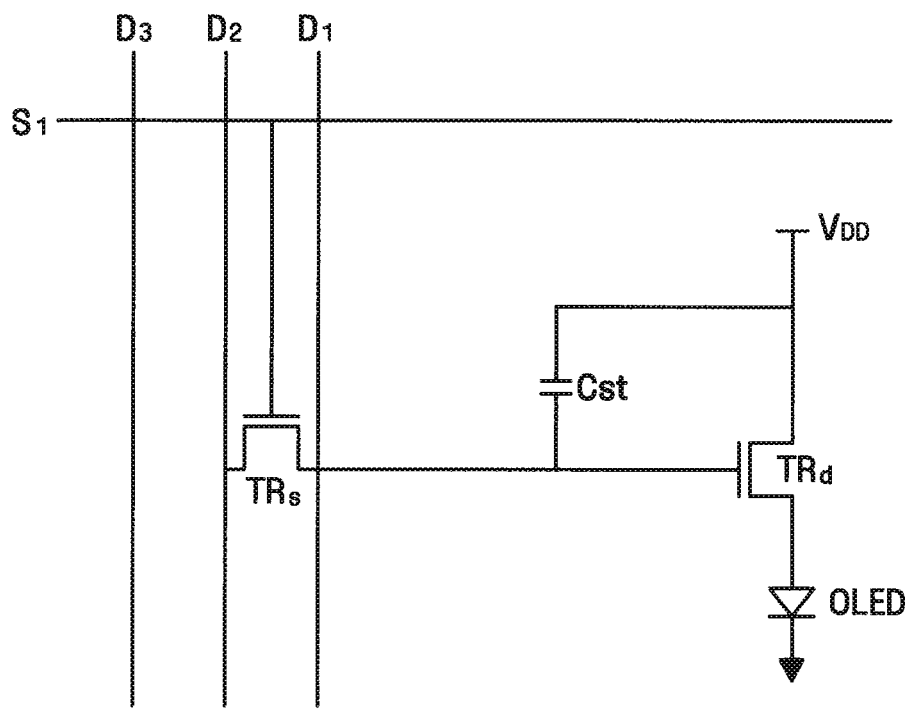
FIG. 3 is an equivalent circuit diagram of a pixel coupled to a second data line in the organic electroluminescent display device of the embodiment shown in FIG. 1.
Figure 4:
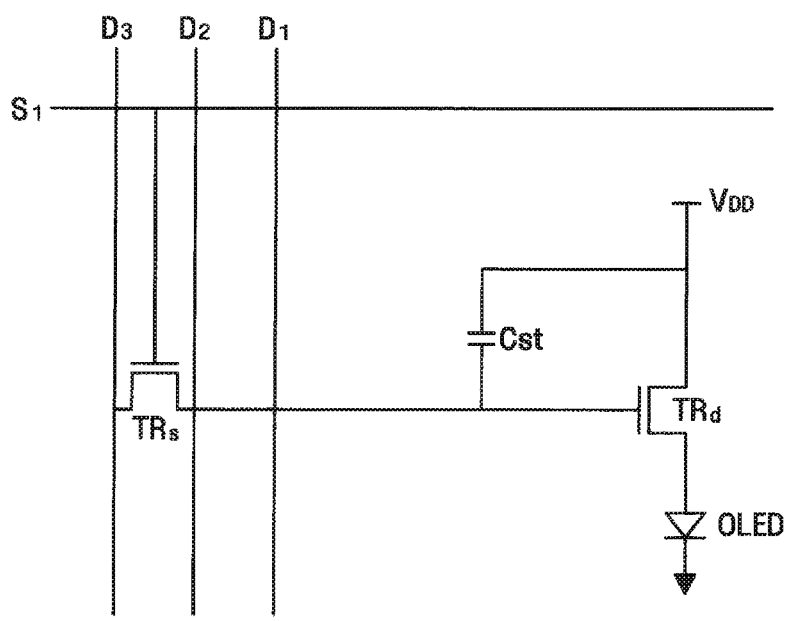
FIG. 4 is an equivalent circuit diagram of a pixel coupled to a third data line in the organic electroluminescent display device of the embodiment shown in FIG. 1.
Figure 5:
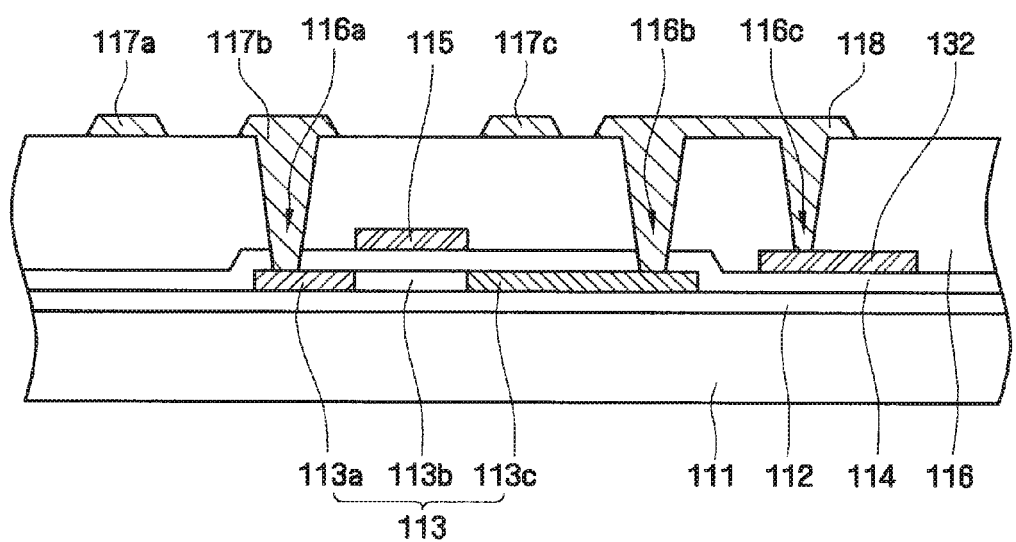
FIG. 5 is a cross-sectional view taken along the line I-I' of FIG. 1.

An organic electroluminescent display device according to an exemplary embodiment will be described with reference to FIGS. 1 through 5. FIG. 1 is a plan view of an organic electroluminescent display device 100 according to an exemplary embodiment of the present invention. FIGS. 2 through 4 are equivalent circuit diagrams of a pixel of the organic electroluminescent display device 100 of the embodiment shown in FIG. 1. FIG. 5 is a cross-sectional view taken along the line I-I' of FIG. 1.

Referring to FIGS. 1 through 5, the organic electroluminescent display device 100 according to the current exemplary embodiment includes a plurality of scan lines $S_1$ through $S_3$, a plurality of data lines $D_1$ through $D_3$, and a common power supply line 150. A plurality of pixels are formed in regions defined by the scan lines $S_1$ through $S_3$ and the data lines $D_1$ through $D_3$. For ease of description, three pixels driven by three data lines $D_1$ through $D_3$, three scan lines $S_1$ through $S_3$, and one common power supply line 150 are illustrated in FIG. 1.

The scan lines $S_1$ through $S_3$ extend in a first direction and transmit scan signals.

The data lines $D_1$ through $D_3$ extend in a second direction crossing the first direction in which the scan lines $S_1$ through $S_3$ extend and transmit data signals. The data lines $D_1$ through $D_3$ are successively located at a side of the pixels. That is, a plurality of data lines $D_1$ through $D_3$ were arranged proximate each of the pixels.

The pixels displaying n different colors may be alternately arranged in the second direction. Here, each of the pixels may be coupled to any one of n data lines successively located at a side thereof. Each of the pixels may be coupled to a different data line according to the color that it displays. In FIG. 1, three pixels respectively displaying red, green, and blue are alternately arranged in the second direction, and three data lines corresponding respectively to the red, green, and blue pixels are successively located in the second direction at a side of the red, green, and blue pixels. Here, the first direction may be a row direction, and the second direction may be a column direction.

The pixels may be longer in the row direction than in the column direction. When the pixels are longer in the row direction than in the column direction, if scan lines extend in the column direction while data lines extend in the row direction, the number of scan lines increases. The increased number of scan lines decreases a 1H time, thereby reducing a data charging time. However, when the scan lines extend in the row direction while the data lines extend in the column direction, as illustrated in FIG. 1, the 1H time increases, thereby securing the data charging time.

Referring to FIG. 1, the organic electroluminescent display device 100 according to the current exemplary embodiment includes a first thin-film transistor (TFT) 110, a second TFT 120, a first capacitor 130, and an organic light-emitting element 140 in a pixel.

The first TFT 110 functions as a switching element that selects a pixel to emit light by switching (e.g., applying to the selected pixel) a data voltage applied to one of the data lines $D_1$ through $D_3$ in response to a selection signal transmitted to one of the scan lines $S_1$ through $S_3$.

Referring to FIG. 5, the first TFT 110 includes a first gate electrode 115, a first source electrode 117b, a first drain electrode 118, and a first active layer 113.

A buffer layer 112 is formed on a substrate 111. The substrate 111 may be made of an insulating material, such as glass, quartz, or plastic, or metal. The buffer layer 112 prevents or reduces penetration of impurities into the substrate 111, and also planarizes the surface of the substrate 111. The buffer layer 112 may be made of any material as long as it can perform these functions. The buffer layer 112 is not essential, and may be omitted depending on the type of the substrate 111 and processing conditions.

The first active layer 113 is formed on the buffer layer 112. The first active layer 113 may be made of amorphous silicon or polycrystalline silicon. When made of polycrystalline silicon, the first active layer 113 may have higher charge mobility than when made of amorphous silicon. The first active layer 113 includes a first channel region 113b and also includes a first source region 113a and a first drain region 113c situated at respective sides of the first channel region 113b. The first channel region 113b is not doped with impurities, and the first source region 113a and the first drain region 113c are doped with p-type or n-type impurities. The type of impurities may vary according to the type of the first TFT 110.

A gate insulating film 114 is formed on the first active layer 113. The gate insulating film 114 may be made of silicon nitride or silicon oxide.

The first gate electrode 115 is formed on the gate insulating film 114 and overlaps the first channel region 113b. The first gate electrode 115 is electrically coupled to one of the scan lines $S_1$ through $S_3$. In FIG. 1, one first gate electrode 115 is illustrated. However, the current exemplary embodiment is not limited thereto, and two or more first gate electrodes may be formed as desired by those of ordinary skill in the art.

An interlayer insulating film 116 covering the first gate electrode 115 is formed on the gate insulating film 114.

The first source electrode 117b and the first drain electrode 118 are formed on the interlayer insulating film 116 and are electrically coupled to the first source region 113a and the first drain region 113c of the first active layer 113, respectively, through contact holes 116a and 116b formed in the interlayer insulating film 116. Wirings 117a and 117c formed on the interlayer insulating film 116 are data lines.

The first source electrode 117b may be electrically coupled to one of the data lines $D_1$ through $D_3$. In FIG. 5, the data line $D_2$ is electrically coupled to the first source region 113a of the first active layer 113 through the contact hole 116a. That is, the data line $D_2$ is the first source electrode 117b (e.g., is coupled to the first source electrode 117b). The first drain electrode 118 is electrically coupled to a first lower electrode 132 of the first capacitor 130 through a contact hole 116c. In this structure, the pixel is electrically coupled to any one of the data lines $D_1$ through $D_3$ successively located at a side thereof by the first TFT 110. In addition, the first TFT 110 is driven by a gate voltage applied to scan line $S_2$ and delivers a data voltage applied to data line $D_2$ to the second TFT 120.

The first TFT 110 is formed between an $n^{th}$ data line and an $(n-1)^{th}$ data line, which are successively located at a side of the pixel. In this case, the pixel is coupled to the $n^{th}$ data line by the first TFT 110. Here, n is an integer equal to or greater than two. The first TFT 110 coupled to the first data line $D_1$ is formed in a pixel region. When two gate electrodes are formed, if the first TFT 110 is coupled to the $n^{th}$ data line, the $(n-1)^{th}$ data line is situated between the two gate electrodes.

In FIG. 1, a case where n is equal to three is illustrated as an example. More specifically, a red pixel, a green pixel, and a blue pixel are alternately arranged in the second direction, and the third data line $D_3$, the second data line $D_2$, and the first data line $D_1$ are successively located (e.g., from left to right) at a side of the red, green, and blue pixels. The first TFT 110 coupled to the first data line $D_1$ may be formed in a pixel region, the first TFT 110 coupled to the second data line $D_2$ may be formed between the second data line $D_2$ and the first data line $D_1$, and the first TFT 110 coupled to the third data line $D_3$ may be formed between the third data line $D_3$ and the second data line $D_2$.

FIG. 2 is an equivalent circuit diagram of a pixel coupled to the first data line $D_1$. FIG. 3 is an equivalent circuit diagram of a pixel coupled to the second data line $D_2$. FIG. 4 is an equivalent circuit diagram of a pixel coupled to the third data line $D_3$.

When n data lines are successively arranged at a side of the pixel, if the first TFT 110 coupled to the $n^{th}$ data line is formed in a pixel region, the first active layer 113 of the first TFT 110 and (n−1) data lines may overlap each other with an insulating layer interposed therebetween. Accordingly, unwanted parasitic capacitance may be generated between the first active layer 113 of the first TFT 110 and the (n−1) data lines. The parasitic capacitance increases a data resistance-capacitance (RC) value and distorts a data value. However, in the organic electroluminescent display device 100 according to the current exemplary embodiment, the first TFT 110 coupled to the $n^{th}$ data line is formed between the $n^{th}$ data line and the $(n-1)^{th}$ data line (e.g., below an area between the $n^{th}$ data line and the $(n-1)^{th}$ data line). Therefore, the generation of parasitic capacitance between the first TFT 110 and the first through $(n-1)^{th}$ data lines may be prevented or reduced. Consequently, RC delay due to an increase in the data RC value is reduced.

Referring back to FIG. 1, the second TFT 120 functions as a driving transistor that drives the selected organic light-emitting element 140. The second TFT 120 includes a second gate electrode 125, a second source electrode 127, a second drain electrode 128, and a second active layer 123. The structure of the second TFT 120 is identical to the above-descried structure of the first TFT 110, and thus, a detailed description thereof is omitted.

The second gate electrode 125 is coupled to the first lower electrode 132 of the first capacitor 130, the second source electrode 127 is coupled to the common power supply line 150 through a contact hole, and the second drain electrode 128 is coupled to a pixel electrode 142 of the organic light-emitting element 140 through a contact hole. In this structure, when the first TFT 110 is turned on by a selection signal, a data voltage is applied to the second gate electrode 125 of the second TFT 120, and a current (e.g., a predetermined current) is supplied to the pixel electrode 142.

The first capacitor 130 includes the first lower electrode 132 and a first upper electrode 131 arranged with the interlayer insulating film 116 interposed therebetween. The first lower electrode 132 is coupled to the first drain electrode 118 of the first TFT 110 through the contact hole 116c, and the first upper electrode 131 is coupled to the common power supply line 150. In this structure, a voltage corresponding to a difference between a data voltage applied from the first TFT 110 and a common voltage applied from the common power supply line 150 to the second TFT 120 is stored in the first capacitor 130, and a current corresponding to the voltage stored in the first capacitor 130 flows to the organic light-emitting element 140 via the second TFT 120. Accordingly, the organic light-emitting element 140 emits light.

The organic light-emitting element 140 includes a pixel electrode (not shown) which corresponds to an anode (i.e., a hole injection electrode), the pixel electrode 142 which corresponds to a cathode (i.e., an electron injection electrode), and an organic light-emitting layer 141 disposed between the anode and the cathode Holes and electrons are injected from the anode and the cathode into the organic light-emitting layer 141, and the injected holes and electrons combine to form excitons. The excitons emit light when they return from an excited state to their ground state. The pixel electrode 142 may be made of a transparent conductive material such as indium tin oxide (ITO), indium zinc oxide (IZO), ZnO, or $In_2O_3$.

Figure 6:
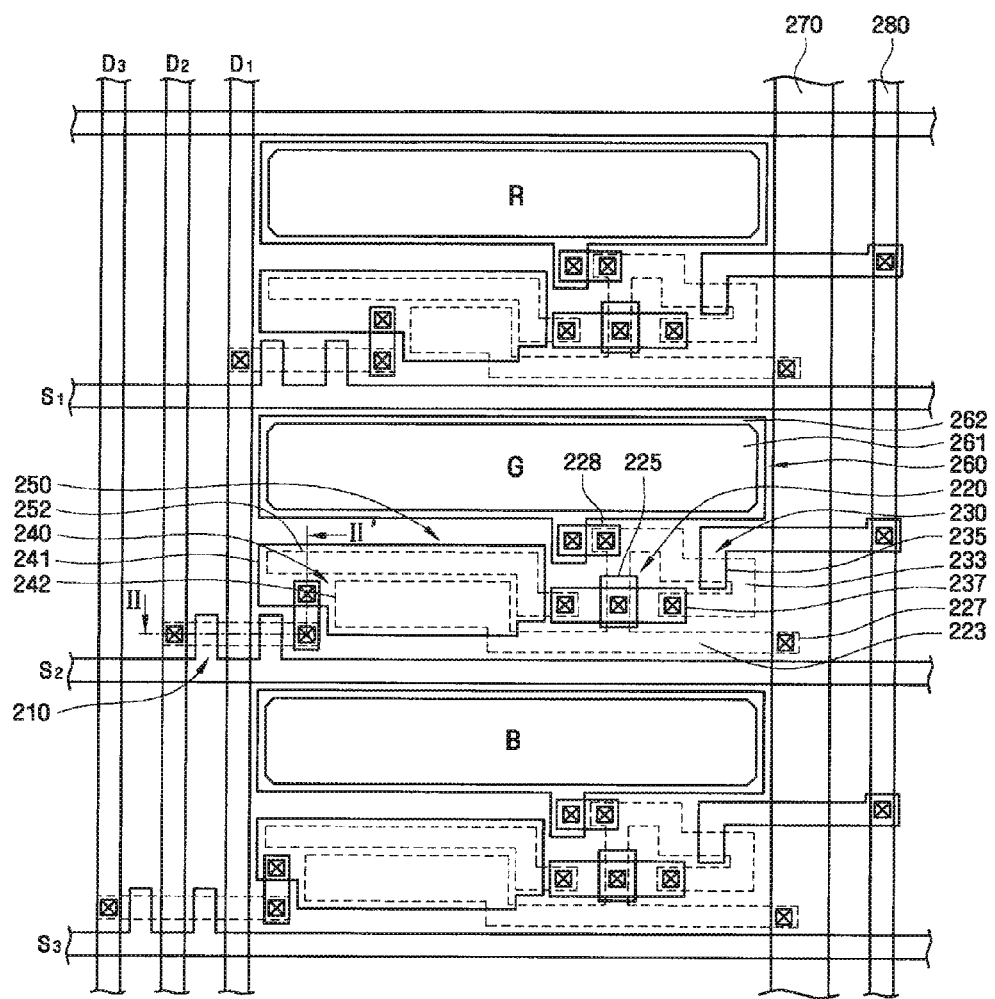
FIG. 6 is a plan view of an organic electroluminescent display device according to another exemplary embodiment of the present invention.
Figure 7:
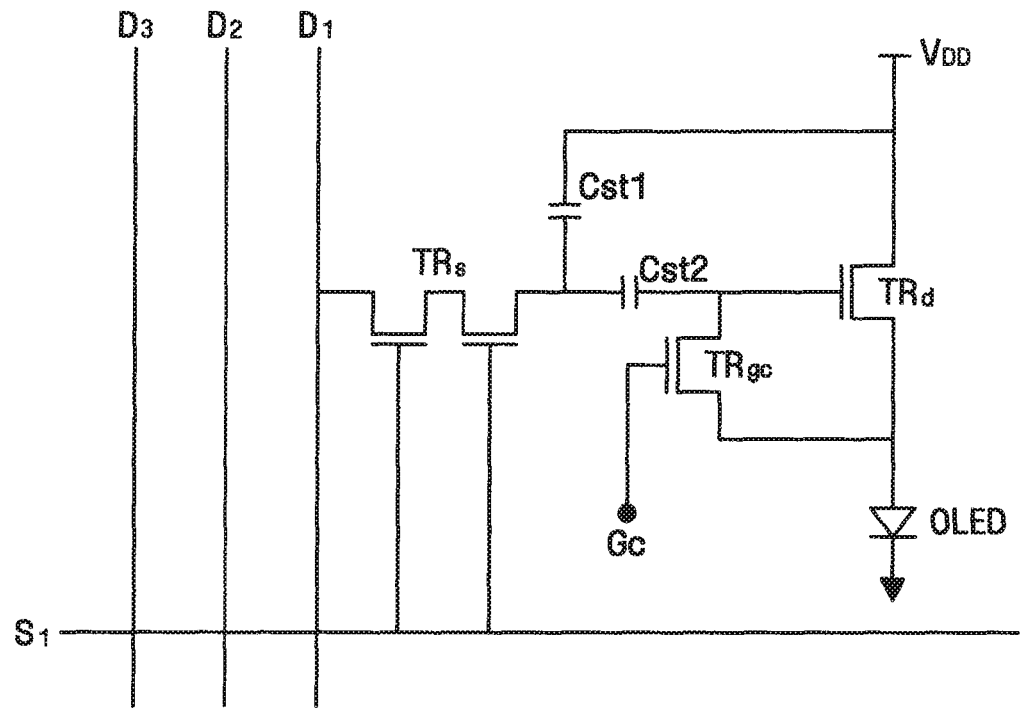
FIG. 7 is an equivalent circuit diagram of a pixel coupled to a first data line in the organic electroluminescent display device of the embodiment shown in FIG. 6.
Figure 8:
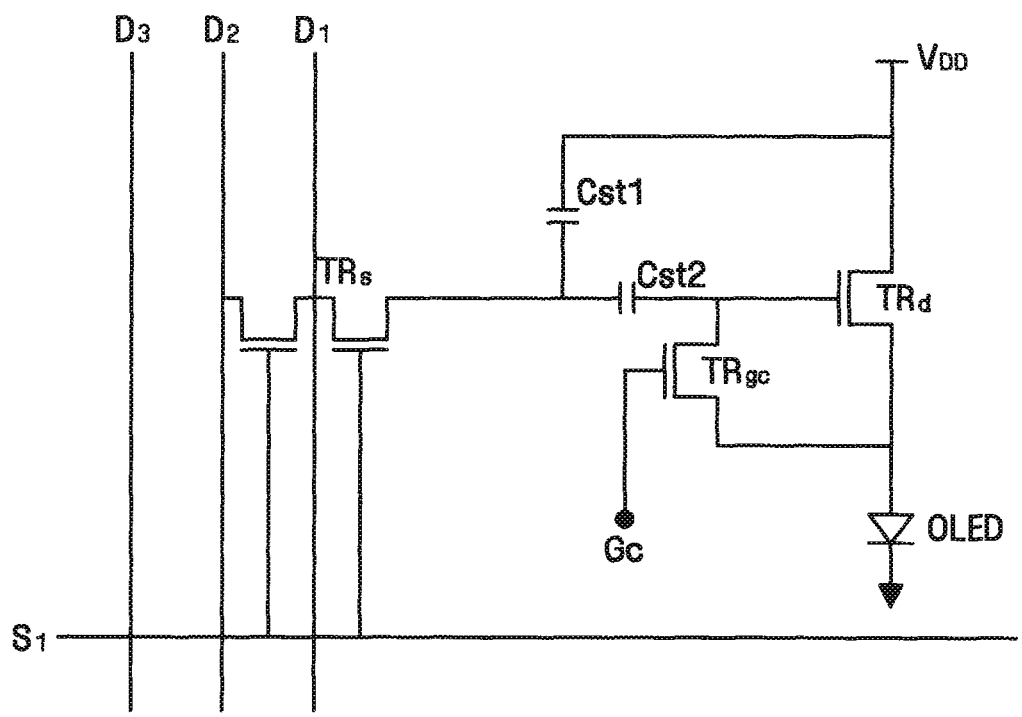
FIG. 8 is an equivalent circuit diagram of a pixel coupled to a second data line in the organic electroluminescent display device of the embodiment shown in FIG. 6.
Figure 9:
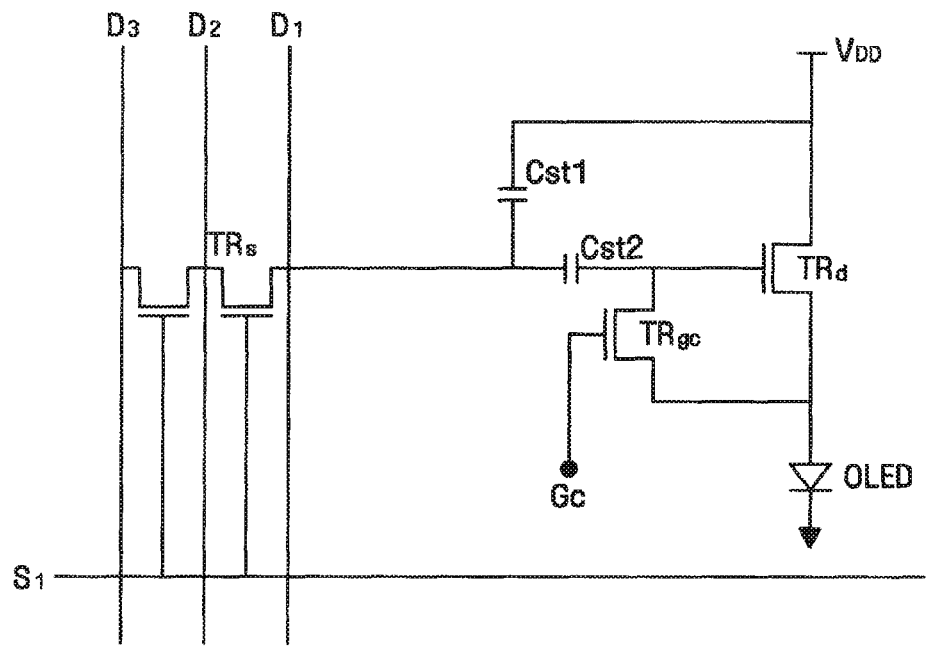
FIG. 9 is an equivalent circuit diagram of a pixel coupled to a third data line in the organic electroluminescent display device of the embodiment shown in FIG. 6.
Figure 10:
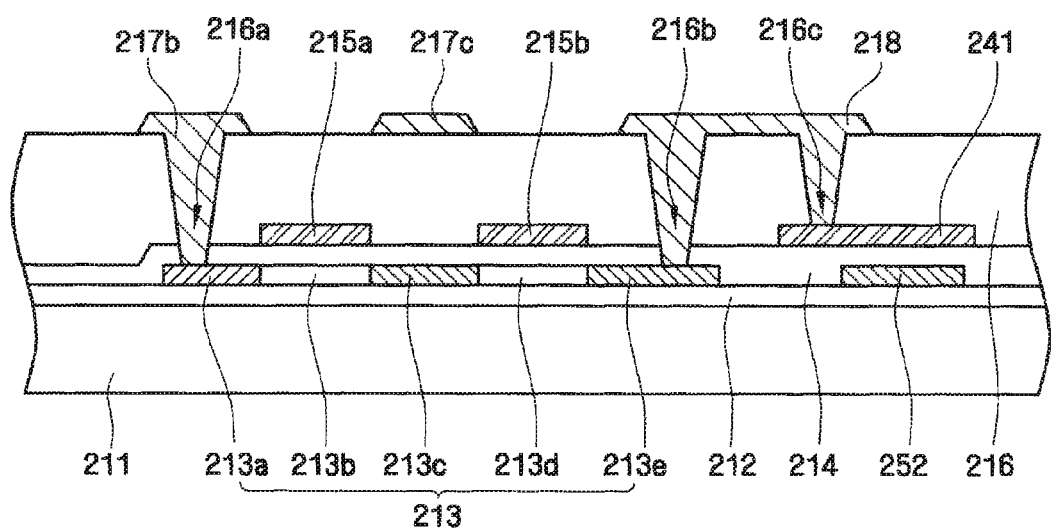
FIG. 10 is a cross-sectional view taken along the line II-II' of FIG. 6.

Hereinafter, an organic electroluminescent display device according to another exemplary embodiment of the present invention will be described with reference to FIGS. 6 through 10. FIG. 6 is a plan view of an organic electroluminescent display device 200 according to another exemplary embodiment of the present invention. FIGS. 7 through 9 are equivalent circuit diagrams of one pixel of the organic electroluminescent display device 200 of the embodiment shown in FIG. 6. FIG. 10 is a cross-sectional view taken along the line II-II' of FIG. 6.

Referring to FIG. 6, the organic electroluminescent display device 200 according to the current exemplary embodiment includes a plurality of scan lines $S_1$ through $S_3$ extending in a first direction, a plurality of data lines $D_1$ through $D_3$ extending in a second direction that crosses the first direction, a common power supply line 270, and a voltage source line 280. A plurality of pixels are formed in regions defined by the scan lines $S_1$ through $S_3$ and the data lines $D_1$ through $D_3$. For ease of description, three pixels driven by three data lines $D_1$ through $D_3$, three scan lines $S_1$ through $S_3$, one common power supply line 270, and one voltage source line 280 are illustrated in FIG. 6.

The scan lines $S_1$ through $S_3$, the data lines $D_1$ through $D_3$, and the common power supply line 270 are identical to those of the organic electroluminescent display device 100 according to the previous exemplary embodiment, and thus a description thereof is omitted.

The pixels displaying different colors may be alternately arranged in the second direction. In FIG. 6, a red pixel, a green pixel, and a blue pixel are alternately arranged in the second direction.

Referring to FIG. 6, in the organic electroluminescent display device 200 according to the current exemplary embodiment, the data lines $D_1$ through $D_3$ are successively located at a side of the pixels. That is, the data lines $D_1$ through $D_3$ corresponding to a plurality of pixels arranged in the second direction are simultaneously and successively located at a side of the pixels. Each of the pixels is coupled to any one of the data lines $D_1$ through $D_3$ by a first TFT 210. Here, the second direction may be a column direction.

A pixel of the organic electroluminescent display device 200 according to the current exemplary embodiment includes the first TFT 210, a second TFT 220, a third TFT 230, a first capacitor 240, a second capacitor 250, and an organic light-emitting element 260.

The first TFT 210 may be formed between the data lines $D_1$ through $D_3$ which are successively located at a side of the pixel. That is, if the pixel is coupled to an $n^{th}$ data line, the first TFT 210 (e.g., a gate of the first TFT 210) may be formed between the $n^{th}$ data line and an $(n-1)^{th}$ data line (e.g., between a region below $n^{th}$ data line and a region below an $(n-1)^{th}$ data line). More specifically, if the pixel is coupled to the first data line $D_1$, the first TFT 210 is formed within the pixel, and if the pixel is coupled to the second data line $D_2$, the first TFT 210 is formed between the second data line $D_2$ and the first data line $D_1$ (e.g., one gate of the first TFT 210 is formed between the second data line $D_2$ and the first data line $D_1$, while another gate of the first TFT 210 is formed at a side of the data line $D_1$ facing away from the data line $D_2$). In addition, if the pixel is coupled to the third data line $D_3$, the first TFT 210 is formed between the third data line $D_3$ and the second data line $D_2$ (e.g., one gate of the first TFT 210 is formed between the third data line $D_3$ and the second data line $D_2$ while another gate of the first TFT 210 is formed between the second data line $D_2$ and the first data line $D_1$). In FIG. 6, the red pixel, the green pixel, and the blue pixel are sequentially formed in the column direction and are coupled respectively to the first through third data lines $D_1$ through $D_3$, which are formed successively.

Referring to FIG. 10, the first TFT 210 includes a first active layer 213, first gate electrodes 215a and 215b, a first source electrode 217b, and a first drain electrode 218. The first source electrode 217b and the first drain electrode 218 are identical to those of the first TFT 110 of the organic electroluminescent display device 100 according to the previous exemplary embodiment, and thus a detailed description thereof is omitted. Furthermore, wiring 217c formed on the interlayer insulating film 216 is a data line.

Two or more first gate electrodes 215a and 215b may be formed. In FIG. 6, a dual gate structure having two first gate electrodes 215a and 215b is illustrated. However, a single first gate electrode may also be formed as desired by those of ordinary skill in the art.

When the first TFT 210 is coupled to the $n^{th}$ data line, the $(n-1)^{th}$ data line may be situated between the two first gate electrodes 215a and 215b (e.g., at a region above an area between the two first gate electrodes 215a and 215b). This dual gate structure not only reduces the leakage of current but also prevents or reduces the generation of parasitic capacitance by an unselected data line.

The first active layer 213 may be made of amorphous silicon or polycrystalline silicon. The first active layer 213 may include first channel regions 213b and 213d, a first source region 213a, and a first drain region 213e. The first channel regions 213b and 213d are undoped with impurities, and the first source region 213a and the first drain region 213e are situated at both sides of the first channel regions 213b and 213d and are doped with p-type or n-type impurities. In addition, a region 213c doped with impurities may further be formed between the first channel regions 213b and 213d.

Referring to FIG. 6, the second TFT 220 includes a second active layer 223, a second gate electrode 225, a second source electrode 227, and a second drain electrode 228. The second gate electrode 225 is electrically coupled to a second lower electrode 252 of the second capacitor 250 through a contact hole, the second source electrode 227 is coupled to the common power supply line 270 through a contact hole, and the second drain electrode 228 is coupled to the organic light-emitting element 260 through a contact hole. The second active layer 223 is coupled to a first lower electrode 242 of the first capacitor 240. In this structure, a data voltage and a common voltage are applied to the second TFT 220, and a current corresponding to a difference between the data voltage and the common voltage flows to a pixel electrode 262.

The third TFT 230 includes a third active layer 233, a third gate electrode 235, a third source electrode 237, and a third drain electrode 228. The third gate electrode 235 is coupled to the voltage source line 280 through a contact hole, and the third source electrode 237 is coupled to the second lower electrode 252 of the second capacitor 250 through a contact hole. The third drain electrode 228 overlaps the second drain electrode 228. That is, the third drain electrode 228 is the same electrode as the second drain electrode 228, and is coupled to the organic light-emitting element 260 through a contact hole. In this structure, the third TFT 230 is switched by a signal transmitted to the voltage source line 280 and senses a threshold voltage of the second TFT 220. The sensed threshold voltage is stored in the second capacitor 250.

The structures of the second TFT 220 and the third TFT 230 are identical to that of the first TFT 110, and thus a detailed description thereof is omitted.

The first capacitor 240 is formed by a first upper electrode 241 and the first lower electrode 242 overlapping each other with a gate insulating film 214 interposed therebetween. The first upper electrode 241 may be formed of the same material and on the same layer as first through third gate electrodes 215a, 215b, 225 and 235. The first lower electrode 242 may be formed by doping impurities on amorphous silicon or polycrystalline silicon. Here, impurities may be doped in high concentration to reduce resistance. The first lower electrode 242 may be formed on the same layer as first through third active layers 213, 223 and 233. The concentration of impurities in the first lower electrode 242 may be higher than those of impurities in the first through third active layers 213, 223 and 233.

The second capacitor 250 is formed by the first upper electrode 241 and the second lower electrode 252 overlapping each other with the gate insulating film 214 interposed therebetween. The second capacitor 250 and the first capacitor 240 may share the same upper electrode 241. However, separate lower electrodes may be formed to separate the first capacitor 240 from the second capacitor 250. The second lower electrode 252 may be formed of amorphous or polycrystalline silicon doped with impurities.

The organic light-emitting element 260 includes a pixel electrode corresponding to an anode (not shown), the pixel electrode 262 corresponding to a cathode, and an organic light-emitting layer 261 disposed between the anode and the cathode.

Figure 11:
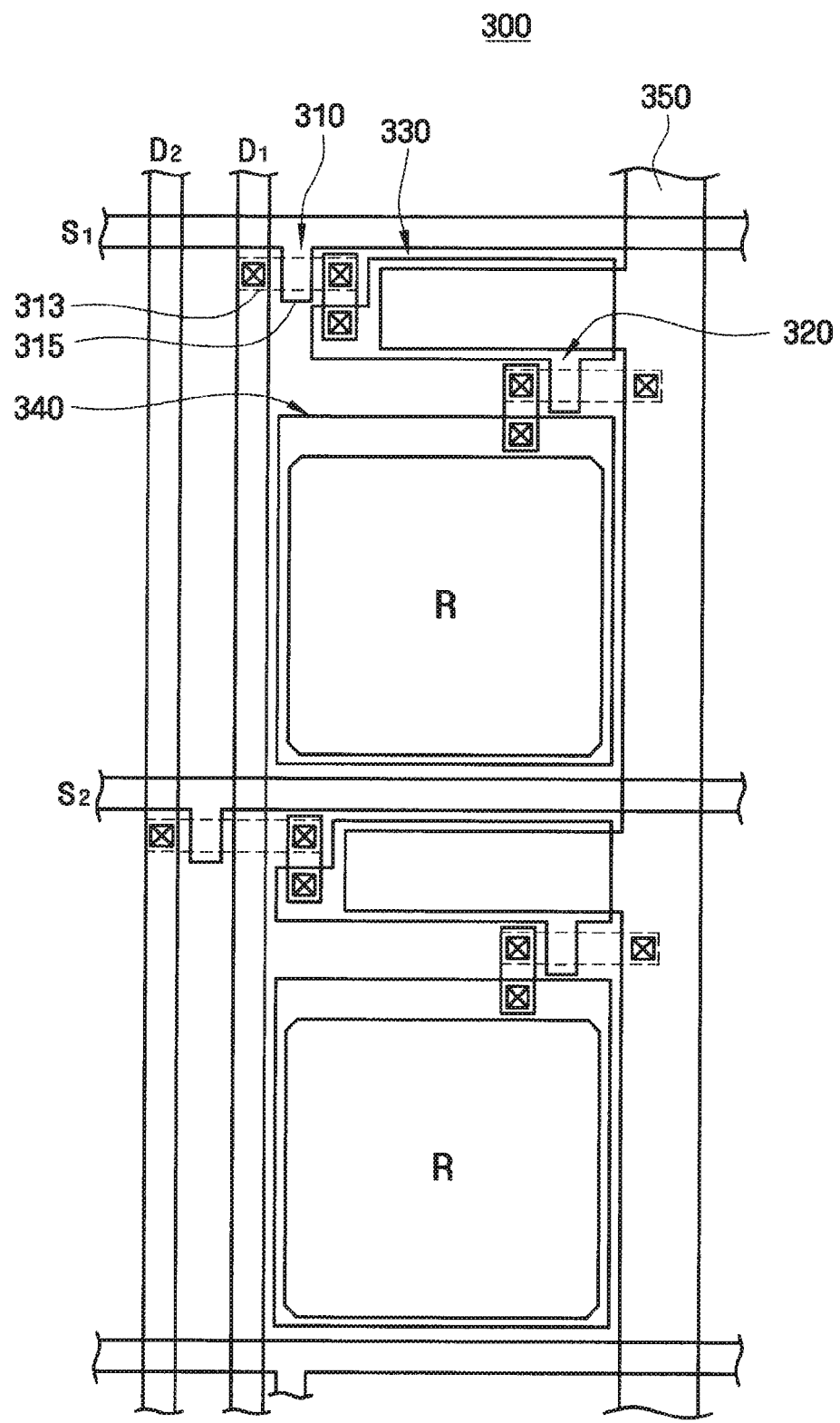
FIG. 11 is a plan view of an organic electroluminescent display device according to another exemplary embodiment of the present invention.

Hereinafter, an organic electroluminescent display device according to another exemplary embodiment of the present invention will be described with reference to FIG. 11. FIG. 11 is a plan view of an organic electroluminescent display device 300 according to another exemplary embodiment of the present invention.

Referring to FIG. 11, the organic electroluminescent display device 300 according to the current exemplary embodiment includes a plurality of scan lines $S_1$ and $S_2$ extending in a first direction, a plurality of data lines $D_1$ and $D_2$ extending in a second direction that crosses the first direction, and a common power supply line 350. A plurality of pixels are formed in regions defined by the scan lines $S_1$ and $S_2$ and the data lines $D_1$ and $D_2$. For ease of description, two pixels driven by two data lines $D_1$ and $D_2$, two scan lines $S_1$ and $S_2$, and one common power supply line 350 are illustrated in FIG. 11.

The data lines $D_1$ and $D_2$ are successively located at a side of the pixels, and each of the pixels is electrically coupled to any one of the data lines $D_1$ and $D_2$ by a first TFT 310.

The pixels displaying the same color may be successively arranged in the second direction. Here, two or more data lines may be successively located at a side of the pixels. That is, two or more data lines may concurrently pass by each pixel. The second direction may be a column direction.

The pixels may be alternately coupled to n data lines. Specifically, if a pixel in an odd-numbered row or column is coupled to an $n^{th}$ data line, a pixel in an even-numbered row or column may be coupled to an $(n-1)^{th}$ data line. In FIG. 11, two or more red pixels are successively located in the column direction. The red pixel in the odd-numbered row is coupled to the first data line $D_1$, and the red pixel in the even-numbered row is coupled to the second data line $D_2$.

If two or more data lines are concurrently arranged to pixels of the same color as described above, the data charging time is reduced.

Referring to FIG. 11, a pixel according to the current exemplary embodiment includes the first TFT 310, a second TFT 320, a first capacitor 330, and an organic light-emitting element 340. The first TFT 310, the second TFT 320, the first capacitor 330, and the organic light-emitting element 340 are identical to those of the above-described organic electroluminescent display device 100 according to the previous exemplary embodiment of FIG. 1, and thus, a detailed description thereof is omitted.

The first TFT 310 includes a first active layer 313 and a first gate electrode 315. In FIG. 11, one first gate electrode 315 is illustrated. However, the current exemplary embodiment is not limited thereto, and two or more first gate electrodes may also be formed.

If the pixel displaying red is coupled to the $n^{th}$ data line, the first TFT 310 is formed between the $n^{th}$ data line and the $(n-1)^{th}$ data line (e.g., at least partially between areas corresponding to the $n^{th}$ data line and the $(n-1)^{th}$ data line). More specifically, if the red pixel is coupled to the first data line $D_1$, the first TFT 310 is formed within the red pixel, and the first data line $D_1$ is coupled to a source region (not shown) of the first active layer 313 through a contact hole. If the red pixel is coupled to the second data line $D_2$, the first TFT 310 is formed between the second data line $D_2$ and the first data line $D_1$ (e.g., at least partially between areas corresponding to the second data line $D_2$ and the first data line $D_1$). In addition, when two first gate electrodes are formed, if the pixel is coupled to the $n^{th}$ data line, the $(n-1)^{th}$ data line may be situated between (e.g., above an area that is between) the two first gate electrodes.

This structure may prevent the first active layer 313 of the first TFT 310 and the first through $(n-1)^{th}$ data lines from overlapping each other between the $n^{th}$ data line and the first TFT 310 with an insulating film interposed therebetween and, thus, from generating parasitic capacitance.

Figure 12:
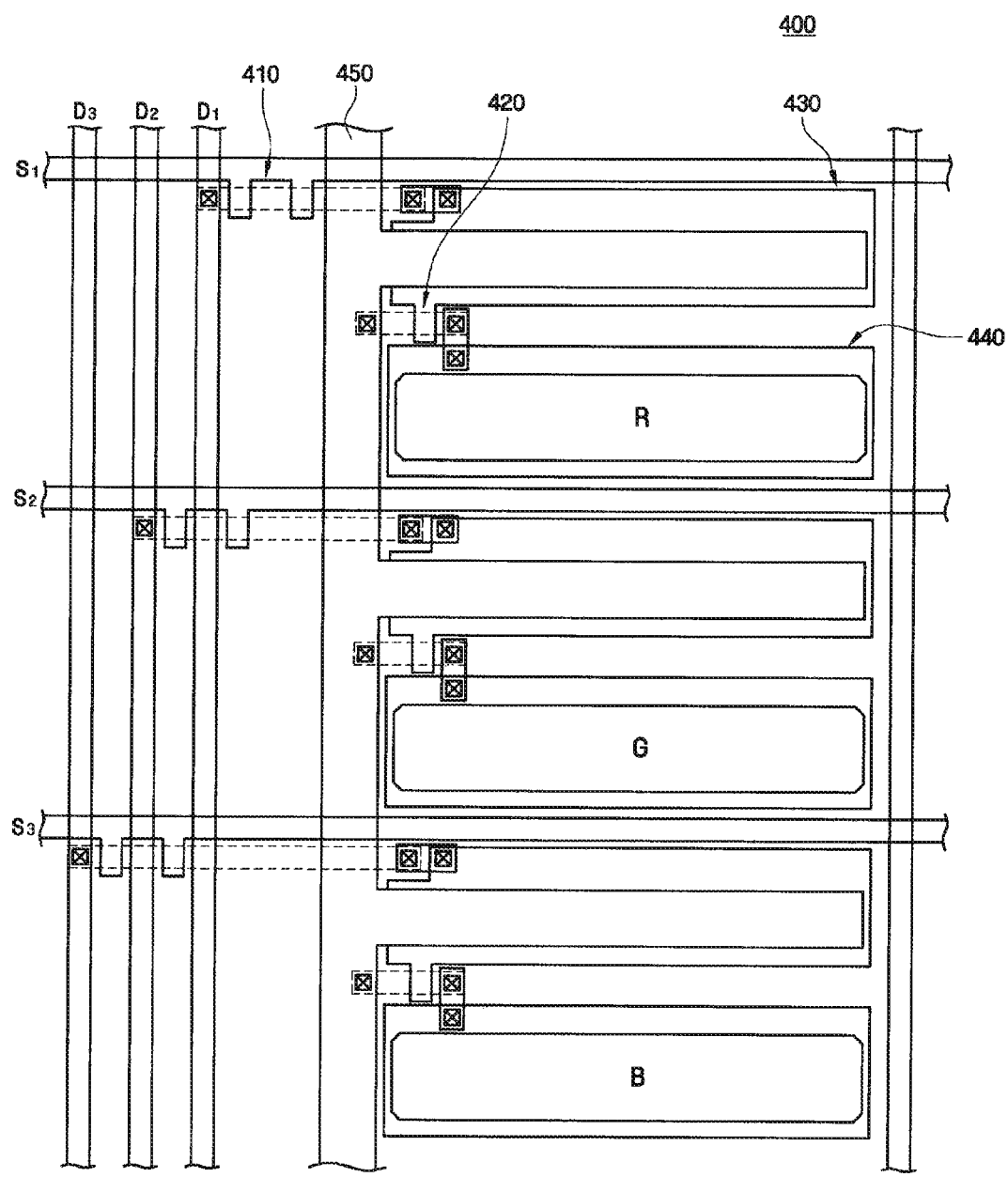
FIG. 12 is a plan view of an organic electroluminescent display device according to another exemplary embodiment of the present invention.

Hereinafter, an organic electroluminescent display device according to another exemplary embodiment of the present invention will be described with reference to FIG. 12. FIG. 12 is a plan view of an organic electroluminescent display device 400 according to another exemplary embodiment of the present invention.

Referring to FIG. 12, the organic electroluminescent display device 400 according to the current exemplary embodiment includes a plurality of scan lines $S_1$ through $S_3$ extending in a first direction, a plurality of data lines $D_1$ through $D_3$ extending in a second direction that crosses the first direction, and a common power supply line 450. A plurality of pixels are formed in regions defined by the scan lines $S_1$ through $S_3$ and the data lines $D_1$ through $D_3$. For ease of description, three pixels driven by three data lines $D_1$ through $D_3$, three scan lines $S_1$ through $S_3$, and one common power supply line 450 are illustrated in FIG. 12.

The data lines $D_3$ through $D_1$ and the common power supply line 450 may be successively located at a side of the pixels. The data lines $D_3$ through $D_1$ and the common power supply line 450 may be located sequentially from farthest to closest to the pixels. The pixels may display different colors and may be alternately arranged in the second direction.

A pixel of the organic electroluminescent display device 400 according to the current exemplary embodiment includes a first TFT 410, a second TFT 420, a first capacitor 430, and an organic light-emitting element 440.

The first TFT 410 may be formed between an $n^{th}$ data line and an $(n-1)^{th}$ data line (e.g., a gate of the first TFT 410 may be formed between an $n^{th}$ data line and an $(n-1)^{th}$ data line) to couple the $n^{th}$ data line and the pixel. Here, since the common power supply line 450 is formed between the first data line $D_1$ and the pixel, the first TFT 410 coupled to the first data line $D_1$ is formed between the first data line $D_1$ and the common power supply line 450 (e.g., between areas corresponding to the first data line $D_1$ and the common power supply line 450).

When the first TFT 410 is formed between the $n^{th}$ data line and the $(n-1)^{th}$ data line as described above, $(n-1)$ data lines and the power supply line 450 may be prevented from overlapping the first active layer of the first TFT 410 and, thus, from generating parasitic capacitance (e.g., prevent from generating as much parasitic capacitance), unlike when the first TFT 410 is formed within the pixel.

The first TFT 410 is identical to that of the above-described organic electroluminescent display device 200 according to the exemplary embodiment of FIG. 6, and thus a detailed description thereof is omitted. In addition, the second TFT 420, the first capacitor 430, and the organic light-emitting element 440 are identical to those of the organic electroluminescent display device 100 according to the exemplary embodiment of FIG. 1, and thus a detailed description thereof is omitted.

In FIG. 12, an active matrix organic electroluminescent display device having a 2Tr-1Cap structure, in which two TFTs and one capacitor are included in one pixel, is illustrated. However, the present invention is not limited to this structure. An organic electroluminescent display device according to the present invention may include three or more TFTs and two or more capacitors in one pixel. Furthermore, additional wirings may be formed so that the organic electroluminescent display device has various structures. For example, a voltage source line may be formed between the pixel and the common power supply line 450.

While the present invention has been particularly shown and described with reference to exemplary embodiments thereof, it will be understood by those of ordinary skill in the art that various changes in form and detail may be made therein without departing from the spirit and scope of the present invention as defined by the following claims and their equivalents. The exemplary embodiments should be considered in a descriptive sense only and not for purposes of limitation.

What is claimed is:

1. An organic electroluminescent display device comprising:
    a plurality of scan lines and a plurality of data lines crossing the scan lines;
    a plurality of pixels at regions defined by the scan lines and the data lines; and
    one or more thin-film transistors (TFTs) for selectively applying voltages to the pixels,
    wherein the data lines are coupled to respective ones of the pixels and are successively located at a same side of all of the respective ones of the pixels, and a first TFT of the TFTs comprises a gate electrode located at least partially between an area corresponding to an $n^{th}$ data line of the data lines and an area corresponding to an $(n-1)^{th}$ data line of the data lines, the $n^{th}$ data line and the $(n-1)^{th}$ data line being successively positioned.

2. The display device of claim 1, wherein at least one of the pixels is coupled to the $n^{th}$ data line by the first TFT.

3. The display device of claim 1, wherein a width of the pixels in a row direction is greater than a length of the pixels in a column direction.

4. The display device of claim 3, wherein the data lines extend in the column direction.

5. The display device of claim 1, wherein the pixels displaying a same color are arranged in a first direction, and the data lines extend along the first direction, wherein each of the pixels is coupled to one of the data lines.

6. The display device of claim 5, wherein the data lines comprise a first data line and a second data line, and successive ones of the pixels are alternately coupled to the first data line and the second data line.

7. The display device of claim 1, wherein the first TFT is a switching element for applying a data voltage applied to one of the data lines in response to a selection signal transmitted to one of the scan lines.

8. The display device of claim 1, wherein the first TFT further comprises an additional gate electrode, and the $(n-1)^{th}$ data line is located at a region corresponding to an area between the two gate electrodes.

9. An organic electroluminescent display device comprising:
    a plurality of scan lines and a plurality of data lines crossing the scan lines;
    a plurality of pixels located at regions defined by the scan lines and the data lines; and
    one or more TFTs for selectively applying voltages to each of the pixels,
    wherein the pixels displaying n different colors are alternately arranged in a first direction, and are respectively coupled to n data lines that are successively located at a same side of all of the pixels to extend along the first direction, and
    wherein at least a portion of a gate electrode of a first TFT of the TFTs is between areas corresponding to successive data lines of the n data lines.

10. The display device of claim 9, wherein the first TFT corresponding to the pixel coupled to an $n^{th}$ data line of the data lines is located between an area corresponding to the $n^{th}$ data line and an area corresponding to an $(n-1)^{th}$ data line of the data lines.

11. The display device of claim 9, wherein a red pixel, a green pixel, and a blue pixel are successively arranged in the first direction and are coupled to different ones of the data lines, respectively.

12. The display device of claim 9, wherein a width of the pixels in a row direction is greater than a length of the pixels in a column direction.

13. The display device of claim 9, wherein the first direction is a column direction.

14. The display device of claim 9, wherein each of the pixels comprises two or more TFTs and two or more capacitors electrically coupled to respective ones of the TFTs.

15. The display device of claim 9, wherein the first TFT is a switching element for applying a data voltage applied to one of the data lines in response to a selection signal transmitted to one of the scan lines.

16. An organic electroluminescent display device comprising:
a plurality of scan lines and a plurality of data lines crossing the scan lines;
a plurality of pixels at regions defined by the scan lines and the data lines;
a common power supply line for supplying common power to the pixels; and
one or more TFTs for selectively applying voltages to each of the pixels,
wherein the data lines are coupled to respective ones of the pixels, and
wherein the data lines and the common power supply line are successively and sequentially located at a same side of all of the respective ones of the pixels from farthest from the pixels to closest to the pixels, and a first TFT of the TFTs comprises a gate electrode that is at least partially between an area corresponding to an $n^{th}$ data line of the data lines and an area corresponding to an $(n-1)^{th}$ data line of the data lines, the $n^{th}$ data line and the $(n-1)^{th}$ data line being successively located.

17. The display device of claim 16, wherein the first TFT is coupled to the $n^{th}$ data line, wherein the $(n-1)^{th}$ data line is closest to the pixels, and wherein the first TFT is at least partially between the $(n-1)^{th}$ data line and the common power supply line.

18. The display device of claim 16, wherein the first TFT further comprises an additional gate electrode, and the $(n-1)^{th}$ data line is located at a region corresponding to an area between the two gate electrodes.

* * * * *